United States Patent [19]

Damon et al.

[11] Patent Number: 4,887,981
[45] Date of Patent: Dec. 19, 1989

[54] ELECTRONIC SOCKET CARRIER SYSTEM

[75] Inventors: Neil F. Damon, Fort Pierce, Fla.; Ronald E. Senor, North Attleboro, Mass.

[73] Assignee: Augat Inc., Mansfield, Mass.

[21] Appl. No.: 125,349

[22] Filed: Nov. 25, 1987

[51] Int. Cl.$^4$ .............................................. H01R 9/24
[52] U.S. Cl. ..................................... 439/885; 29/845; 29/874; 206/329; 206/330
[58] Field of Search ..................................... 439/81–83, 439/885–889, 876, 891; 206/328–330; 29/837, 842, 845, 874, 882, 884

[56] References Cited

U.S. PATENT DOCUMENTS

| | | | |
|---|---|---|---|
| 1,451,827 | 4/1923 | Hobson . | |
| 2,901,526 | 8/1959 | Huntley et al. | 136/135 |
| 3,048,268 | 8/1962 | Rocchi et al. | 206/65 |
| 3,097,360 | 7/1963 | Carlson, Jr. et al. | 1/56 |
| 3,140,773 | 7/1964 | Cheh | 198/131 |
| 3,171,535 | 3/1965 | Harris | 198/131 |
| 3,182,276 | 5/1965 | Ruehlemann | 339/17 |
| 3,211,284 | 10/1965 | Anstett | 206/56 |
| 3,279,148 | 10/1966 | Henn | 53/252 |
| 3,517,803 | 6/1970 | Frompovicz et al. | 206/56 |
| 3,545,606 | 12/1970 | Bennett et al. | 206/56 |
| 3,608,711 | 9/1971 | Wheeler | 206/56 A |
| 3,650,430 | 3/1972 | Siegmar et al. | 220/23.8 |
| 3,653,498 | 4/1972 | Kisor | 206/46 H |
| 3,701,346 | 10/1972 | Patrick, Jr. | 128/2.06 E |
| 3,789,402 | 1/1974 | Horecky | 439/888 |
| 3,841,472 | 10/1974 | Fuller et al. | 206/329 |
| 3,892,313 | 7/1975 | Lange | 206/346 |
| 3,994,394 | 11/1976 | McRostie et al. | 206/329 |
| 4,099,615 | 7/1978 | Lemke et al. | 206/329 |
| 4,106,619 | 8/1978 | Haytayan | 206/346 |
| 4,193,287 | 3/1980 | Pfeiffer | 29/593 |
| 4,209,893 | 7/1980 | Dyce et al. | 29/522 |
| 4,218,953 | 8/1980 | Haytayan | 85/68 |
| 4,220,384 | 9/1980 | Clark et al. | 339/59 |
| 4,274,537 | 6/1981 | Cooper | 206/329 |
| 4,296,993 | 10/1981 | Wellington | 439/876 |
| 4,298,120 | 11/1981 | Kaneko et al. | 206/329 |
| 4,373,262 | 2/1983 | Blakesley | 29/874 |
| 4,415,085 | 11/1983 | Clarke et al. | 206/526 |
| 4,442,938 | 4/1984 | Murphy | 206/329 |
| 4,466,689 | 8/1984 | Davis et al. | 29/874 |
| 4,802,862 | 2/1989 | Seidler | 439/876 |

FOREIGN PATENT DOCUMENTS

| | | |
|---|---|---|
| 1225309 | 3/1971 | United Kingdom . |
| 1262201 | 2/1972 | United Kingdom . |
| 1270631 | 4/1972 | United Kingdom . |
| 1466057 | 3/1977 | United Kingdom . |
| 1471124 | 4/1977 | United Kingdom . |

OTHER PUBLICATIONS

Holtite Socket Insertion Machine, Class 736, 1977 Augat Inc.

Primary Examiner—P. Austin Bradley
Attorney, Agent, or Firm—Weingarten, Schurgin, Gagnebin & Hayes

[57] ABSTRACT

An electronic socket carrier system in which a plurality of lead sockets are mounted on a thin flexible carrier strip which can be removed from the sockets after their mounting on a circuit board. The lead sockets each include retention elements on the socket body to retain the socket on the carrier strip and which can also be employed for locking the socket into a mounting hole of a circuit board. The sockets are preferably cold formed and have a plurality of barbs each with a ramp surface to facilitate installation of the sockets into cooperative holes in the carrier strip, and an edge portion for retaining the socket once installed on the carrier strip.

3 Claims, 4 Drawing Sheets

ELECTRONIC SOCKET CARRIER SYSTEM

FIELD OF THE INVENTION

This invention relates to electronic sockets for receiving the leads of electronic components and more particularly relates to sockets adapted to be removably attached to a flexible carrier for transport and component insertion.

BACKGROUND OF THE INVENTION

Electronic lead sockets are known for use in circuit boards and in socket bodies for receiving the leads of electronic components. The socket in one well-known form comprises a sleeve having an interior cylindrical bore usually with a tapered entry opening at one end and a interconnection pin such as a solder tail or wire-wrapping tail on the opposite end. Contact fingers are provided within the bore of the sleeve and which pluggably receive the leads of a circuit component. The socket is installed in a plated-through opening of the circuit board by press fitting the sleeve into an associated hole with a portion of the sleeve being in intimate engagement with the surrounding hole surface to provide mechanical retention of the socket and electrical connection between the plated hole and socket. The sockets are also employed in an array disposed within a body of insulating material to provide a multiple lead socket in a pattern to accept a corresponding lead pattern of an electronic component.

It is also known to mount sockets onto a carrier strip of flexible material by which the sockets can be coiled onto a reel for ease of transport and for use in automatic or semiautomatic assembly machines. One known version of such a carrier strip mounting is shown in U.S. Pat. No. 4,442,938. The socket there shown has a circumferential V-shaped groove provided in the head of the socket adjacent to the entrance opening of the socket, the groove being sized in relation to an opening in a thin carrier strip such that the socket can be snapped into a carrier strip hole and retained on the carrier strip. A plurality of strip-mounted sockets can be installed into cooperative mounting openings of a circuit board and after soldering of the sockets into the board, the flexible strip can be peeled from the soldered sockets.

The dimensions of the circumferential groove must be accurately maintained in relation to the dimensions of the carrier strip hole to provide for suitable retention of the socket on the carrier strip. Loading of the sockets onto the carrier strip is difficult and requires relatively large force to snap the socket through the hole in the strip for seating in the circumferential groove. The formation of the circumferential groove also results in removal of material and thus material waste.

SUMMARY OF THE INVENTION

In accordance with the present invention a lead socket is provided for use with an associated carrier strip and which is fabricated in a relatively inexpensive manner preferably by cold forming or cold heading procedures, and in which retention elements are formed on the socket to retain the socket in a carrier strip, and which can also be employed for locking the socket into a mounting hole of a circuit board. The retention elements are cold formed by upsetting the socket material with no removal of material during the upsetting process. The cold formed socket is less expensive to fabricate than machined sockets. Moreover, no metal is removed during the fabrication process, thus there is no material waste as there is in machined parts.

DESCRIPTION OF THE DRAWINGS

The invention will be more fully understood from the following detailed description taken in conjunction with the accompanying drawings in which.

DETAILED DESCRIPTION OF THE INVENTION

Figure 1:
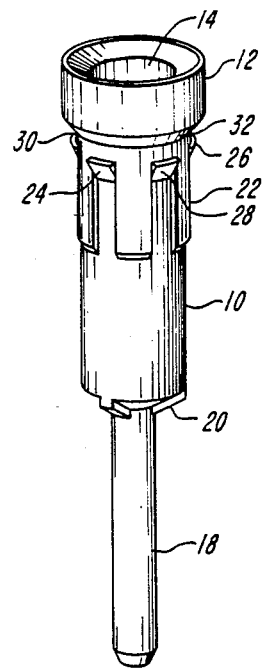
FIG. 1 is a pictorial view of an embodiment of a lead socket in accordance with the invention.
Figure 2A:
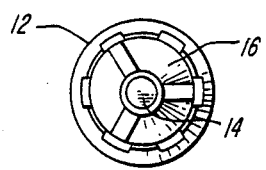
FIG. 2A is a bottom view of the embodiment of FIG. 1.
Figure 2B:
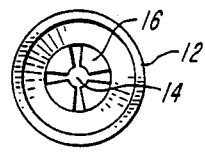
FIG. 2B is a top view of the embodiment of FIG. 1.

A lead socket in accordance with the invention is shown in FIGS. 1 and 2 and includes a sleeve 10 having an enlarged head portion 12 which surrounds an internal bore 14 extending axially into the sleeve and in which a multi-finger contact 16 is disposed for engagement with a component lead inserted therein. A terminal pin 18 axially extends from the sleeve, and a plurality of ribs 20 are circumferentially spaced about the bottom end of the sleeve and which serve as standoffs for mounting of the socket onto a circuit board and provide degassing spaces during soldering of the socket onto the circuit board. This degassing feature is shown in patents 4,236,776 and 4,296,993, both assigned to the present assignee. The sleeve 10 includes a portion 22 adjacent to the head portion 12 which is of smaller diameter than the head portion and of greater diameter than that of the lower portion of the sleeve and in which a plurality of barbs 24 are provided. In the illustration of FIG. 1 six barbs 24 are circumferentially equi-spaced and have upper edges 26 which lie on a common circumference. These barbs are cold formed by plowing in an axial direction along portion 22 toward the head 12 to provide the outwardly extending barbs. Each barb has an upwardly and outwardly extending ramp portion 28 and an upper edge 26. A circumferential area 30 on the surface of portion 22 between the edges 26 of the barbs and the lower beveled edge 32 of the head portion 12 serves as an area for receipt of the carrier strip. The distance between the edges 26 and the lower end of the head portion is sized in relation to the thickness of the carrier strip to provide a snug fit between the socket and the strip. The diameter of area 30 is also sized in relation to the diameter of the carrier strip hole to provide a snug fit.

Figure 6:
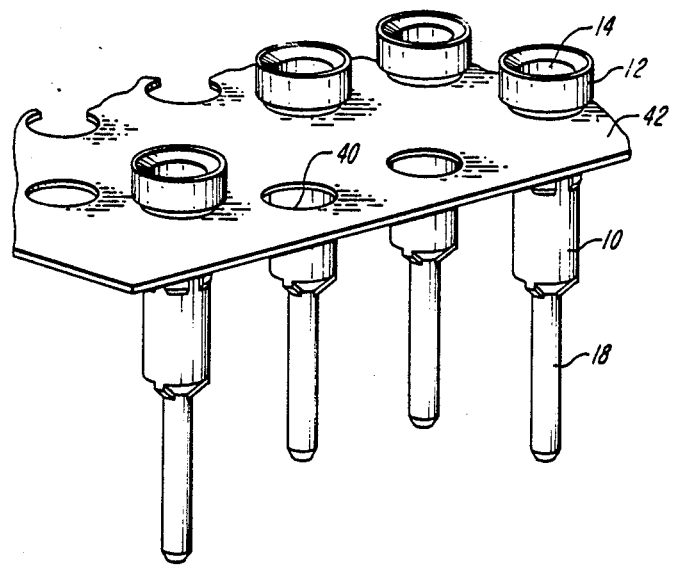
FIG. 6 is a partially cut-away pictorial view of a plurality of lead sockets, of the FIG. 1 embodiment, mounted on a carrier strip.
Figure 7:
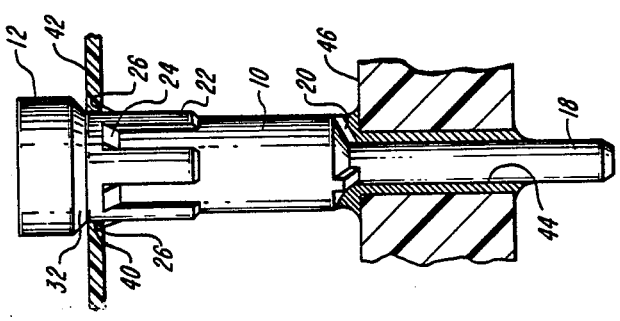
FIG. 7 is an elevation view showing the retention of the socket embodiment of FIG. 1 on a carrier strip and also showing the mounting of the socket in a plated hole.

The lead sockets are inserted tail first into respective holes of a flexible carrier strip as shown in FIG. 6. As each lead socket is pushed into its hole on the carrier sheet 42, the sheet material expands and deforms sufficiently to permit the socket to be driven over the ramp portions 28 and snapped into the sheet, with the sheet being disposed between the head portion and the confronting edges 26 of the barbs as shown in FIG. 7. The opening 40 in the carrier sheet 42 is merely equal to the diameter of the area 30 of the socket, and smaller than the diameter of the head portion 12 and the diameter of the locus defined by the edges 26 of the barbs 24. The ramped surfaces 28 of the barbs 24 facilitate insertion of the sockets into their respective holes in the carrier sheet, while the edges 26 of the barbs serve to retain the sockets on the sheet once installed.

Figure 11:
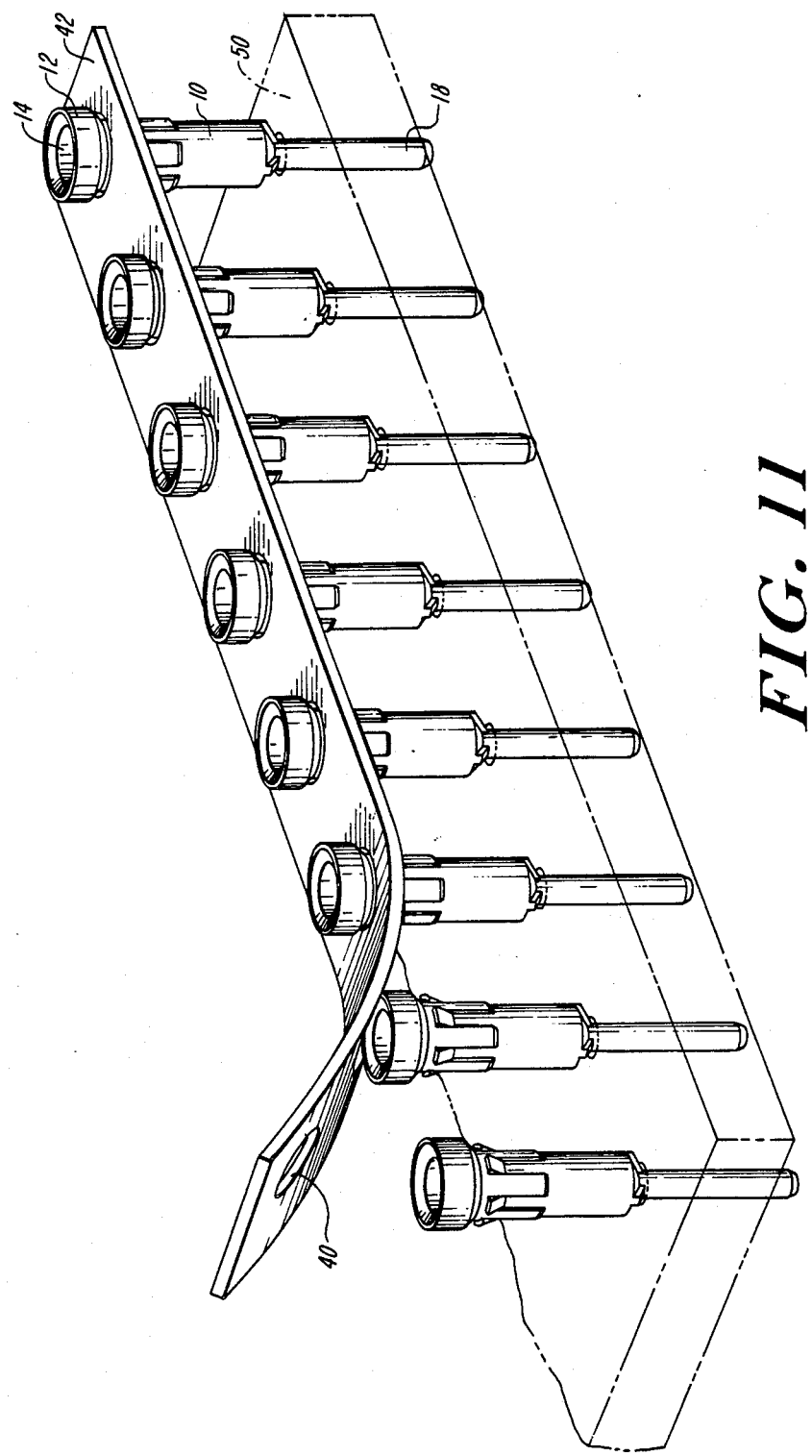
FIG. 11 is an elevation view showing a carrier strip being peeled from mounted sockets.

In use, the lead 18 of the socket is inserted through the plated hole 44 of a circuit board 46 and is soldered therein as shown in FIG. 7 to secure the socket onto the circuit board. Typically an array of sockets carried on the carrier strip are inserted as a group into a cooperative pattern of plated holes in a circuit board, and all of the sockets are then soldered into place. The carrier strip is then peeled from the sockets after the sockets have been soldered into place by upward pulling of the sheet away from the socket heads as shown in FIG. 11. The removal of the carrier sheet is aided by the bevel or chamfer 32 provided on the underside of the head 12 confronting the carrier strip.

Figure 4:
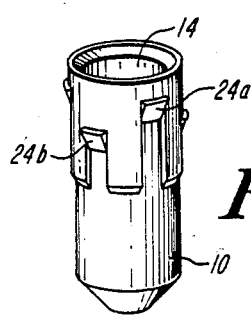
FIG. 4 is a pictorial view of a further embodiment.
Figure 3:
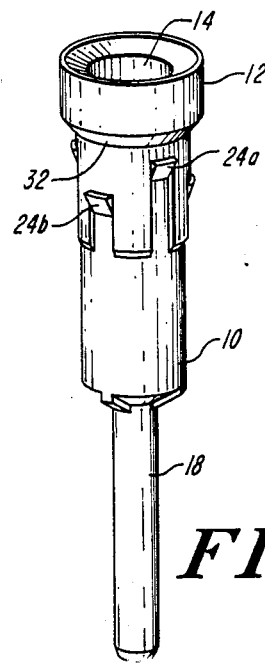
FIG. 3 is a pictorial view of a second embodiment of a lead socket in accordance with the invention.
Figure 5:
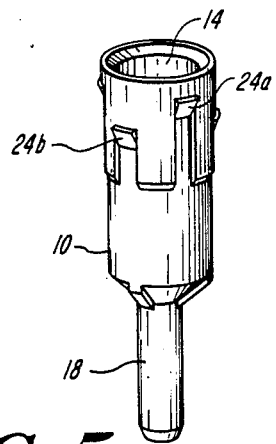
FIG. 5 is a pictorial view of a variation of the embodiment of FIG. 4.
Figure 8:
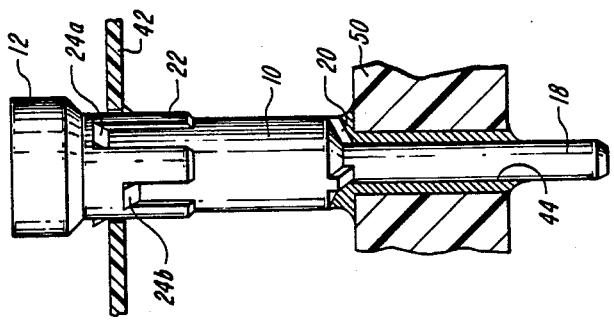
FIG. 8 is an elevation view of the socket embodiment of FIG. 2 mounted on a carrier strip and installed within a plated hole.

Another embodiment is shown in FIG. 3 in which the barbs are disposed in two axially spaced planes. In the illustrated embodiment three circumferentially spaced barbs 24a lie in an upper plane, and three circumferentially spaced barbs 24b lie in a lower plane. The lead sockets can be carried on a carrier strip disposed between the head 12 and the upper set of barbs 24a, or the carrier strip can be disposed between the upper and lower sets of barbs as shown in FIG. 8. The use of two axially spaced sets of barbs allows the retention of headless sockets on a carrier strip. Headless sockets are depicted in FIGS. 4 and 5. The version of FIG. 4 is for insertion within a plated hole of a circuit board. The version of FIG. 5 has a lead 18 for insertion into a plated hole, as described above.

Figure 10:
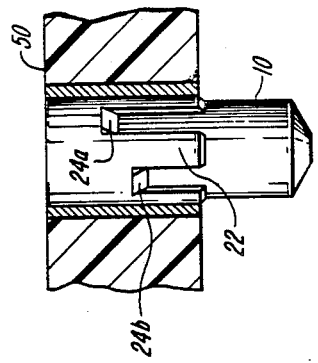
FIG. 10 is an elevation view showing the socket of FIG. 9 after insertion into a plated hole and after removal of the carrier strip.
Figure 9:
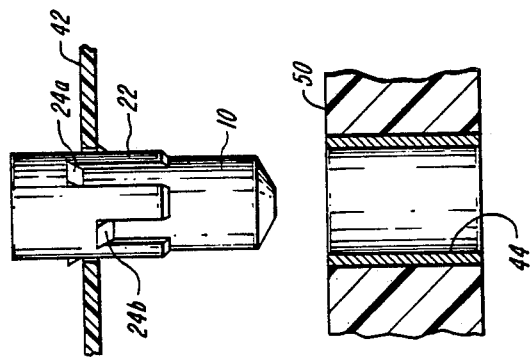
FIG. 9 is an elevation view of the socket embodiment of FIG. 4 mounted on a carrier strip and in position for insertion into a plated hole.

The headless version of FIG. 4 is shown mounted on a carrier strip in FIG. 9 in a position above a plated hole of a circuit board 50. The socket is shown inserted in the plated hole in FIG. 10, with the upper entrance end of the socket substantially flush with the top surface of the circuit board 50. The barbs 24 serve to frictionally engage and bite into the plating of the circuit board mounting hole to retain the socket within the mounting hole. The barbs provide both axial and circumferential retention of the socket in the hole. If desired the headless socket can be soldered into the hole. Preferably, however, the socket is sized in relation to the plated hole to be press fit therein and retained by means of the barbs.

The headless version of the socket shown in FIG. 5 is typically installed with the lead 18 soldered into a mounting opening, as in the embodiments described above. Alternatively, the socket can be press fit and retained within a plated hole by means of the barbs, with the lead 18 outwardly extending from the bottom of the circuit board.

The sockets are preferably made of copper which can readily be cold headed. Other suitable materials can also be employed having the requisite mechanical and electrical properties. The socket can alternatively be fabricated by machining, in which case the socket is typically made of brass, with the barbs being cold formed. Preferably, the socket is entirely formed by cold heading or cold forming processes. The carrier is typically Kapton or Nylon, or other thin flexible sheet material, and typically has a thickness of about 5 mils. The socket in the mounting area is typically about 50 mils in diameter.

The socket carrier system embodying the invention permits easy entry of the sockets onto the carrier strip by the facility of the ramp surfaces on the outwardly extending barbs, and accurate retention of the sockets on the carrier by a single row of barbs and spaced head portion, or by two spaced rows of barbs. The improved carrier system also permits easy removal of the sockets from the carrier after installation of the sockets onto a circuit board.

The invention is not to be limited by what has been particularly shown and described except as indicated in the appended claims.

What is claimed is:

1. An electronic socket for mounting on a flexible carrier strip, comprising:
    a metal sleeve having an internal bore and contacts therein for engaging a lead of an electronic component, the bore having a lead entry at an upper open end;
    a first plurality of circumferentially spaced barbs disposed at a first axial position on the sleeve; and
    a second plurality of circumferentially spaced barbs disposed at a second axial position in the sleeve, wherein;
    the first and second pluralities of barbs are operative to retain the socket within the plated hole of a circuit board.

2. A method of fabricating a lead socket comprising the steps of:
    cold forming a sleeve having a head portion, a first contiguous portion, a second contiguous portion of smaller diameter than the first contiguous portion, and a tapered transition section between the first contiguous portion and second contiguous portion;
    cold forming circumferentially spaced portions of the first contiguous portion to provide circumferentially spaced barbs, wherein said step includes upsetting the first contiguous portion at spaced circumferential positions by plowing the material in an axial direction from the transition section toward the head portion to form the circumferentially spaced barbs which outwardly taper toward the head end.

3. A method of fabricating a lead socket comprising the steps of:
    machining a sleeve having a head portion, a first contiguous portion, a second contiguous portion of smaller diameter than the first contiguous portion, and a tapered transition section between the first contiguous portion and second contiguous portion;
    cold forming circumferentially spaced portion of the first contiguous portion to provide circumferentially spaced barbs, wherein said step includes upsetting the first contiguous portion at spaced circumferential positions by plowing the material in an axial direction from the transition section toward the head portion to form the circumferentially spaced barbs which outwardly taper toward the head end.

* * * * *